US011029365B2

(12) United States Patent
Maejima et al.

(10) Patent No.: US 11,029,365 B2
(45) Date of Patent: Jun. 8, 2021

(54) SEMICONDUCTOR DEVICE

(71) Applicant: Rohm Co., Ltd., Kyoto (JP)

(72) Inventors: Satoshi Maejima, Kyoto (JP); Junichi Hagino, Kyoto (JP)

(73) Assignee: Rohm Co., Ltd., Kyoto (JP)

(*) Notice: Subject to any disclaimer, the term of this patent is extended or adjusted under 35 U.S.C. 154(b) by 326 days.

(21) Appl. No.: 15/802,625

(22) Filed: Nov. 3, 2017

(65) Prior Publication Data

US 2018/0128868 A1 May 10, 2018

(30) Foreign Application Priority Data

Nov. 9, 2016 (JP) ................ JP2016218854

(51) Int. Cl.
| | | |
|---|---|---|
| *H02H 3/08* | (2006.01) | |
| *H02H 3/20* | (2006.01) | |
| *H02H 9/04* | (2006.01) | |
| *H02H 9/02* | (2006.01) | |
| *G01R 31/50* | (2020.01) | |
| *G01R 27/20* | (2006.01) | |
| *H03K 17/687* | (2006.01) | |
| *H01L 27/118* | (2006.01) | |
| *H03K 19/173* | (2006.01) | |

(Continued)

(52) U.S. Cl.
CPC ........... *G01R 31/50* (2020.01); *G01R 27/205* (2013.01); *H01H 83/04* (2013.01); *H01L 27/11803* (2013.01); *H03K 17/0822* (2013.01); *H03K 17/687* (2013.01); *H03K 19/1733* (2013.01)

(58) Field of Classification Search
CPC .............................. G01R 31/025; G01R 31/50

USPC ........................................................ 361/42
See application file for complete search history.

(56) References Cited

U.S. PATENT DOCUMENTS 5,550,702 A * 8/1996 Schmidt ................ H02H 9/025
361/103
2002/0176215 A1* 11/2002 Hiyama ............. H03K 17/0828
361/93.1
(Continued)

FOREIGN PATENT DOCUMENTS

| JP | 09-331669 | 12/1997 |
| JP | 2011-62042 A | 3/2011 |

(Continued)

OTHER PUBLICATIONS

Japanese Patent Office; Notice of Reasons for Refusal in Japanese Patent Application No. 2016-218854 (dated Sep. 1, 2020), with English-language translation.

*Primary Examiner* — Jared Fureman
*Assistant Examiner* — Lucy M Thomas
(74) *Attorney, Agent, or Firm* — Fish & Richardson P.C.

(57) ABSTRACT

A semiconductor device includes an external terminal, a switching output stage that performs switching drive of a terminal voltage at the external terminal, an output control unit arranged to generate a drive signal for the switching output stage according to an input pulse signal, a counter arranged to count the number of pulses of the input pulse signal so as to generate a mask signal, a logical gate arranged to mask the input pulse signal according to the mask signal, and a comparator arranged to compare the terminal voltage with a predetermined threshold value voltage so as to generate a reset signal of the counter.

10 Claims, 8 Drawing Sheets

(51) Int. Cl.
*H01H 83/04* (2006.01)
*H03K 17/082* (2006.01)

(56) References Cited

U.S. PATENT DOCUMENTS

| | | | |
|---|---|---|---|
| 2010/0053998 A1* | 3/2010 | Shimada | H02M 3/33507 363/21.01 |
| 2010/0315017 A1* | 12/2010 | Yu | H02M 1/36 315/291 |
| 2014/0247523 A1 | 9/2014 | Kawano et al. | |
| 2016/0373002 A1* | 12/2016 | Borfigat | H02M 3/156 |
| 2017/0201086 A1* | 7/2017 | Chen | H02H 3/08 |

FOREIGN PATENT DOCUMENTS

| | | |
|---|---|---|
| JP | 2014-150675 A | 8/2014 |
| JP | 2014-171332 A | 9/2014 |

* cited by examiner

SEMICONDUCTOR DEVICE

CROSS-REFERENCE TO RELATED APPLICATIONS

This nonprovisional application claims priority under 35 U.S.C. § 119(a) on Patent Application No. 2016-218854 filed in Japan on Nov. 9, 2016, the entire contents of which are hereby incorporated by reference.

BACKGROUND OF THE INVENTION

Field of the Invention

The invention described in this specification relates to ground fault protection of an external terminal (i.e. a switching drive terminal) provided to a semiconductor device.

Description of Related Art

Conventionally, in various fields, a semiconductor device (such as a switching power supply control IC) is used, which performs switching drive of a terminal voltage at an external terminal.

As an example of a conventional technique concerning the above, JP-A-9-331669 can be cited.

However, in the conventional semiconductor device, if a ground fault (i.e. a short circuit to a ground terminal or a low potential terminal corresponding to the ground terminal) occurs at the external terminal as a target of switching drive, excess current flows from a power supply terminal to the ground terminal via the external terminal, and hence power loss, abnormal heat generation, fuming, firing, element breakdown, or the like may be caused.

SUMMARY OF THE INVENTION

In view of the above-mentioned problem found by the inventors of this application, it is an object of the invention disclosed in this specification to provide a semiconductor device capable of performing an appropriate ground fault protection.

Accordingly, a semiconductor device disclosed in this specification includes an external terminal, a switching output stage arranged to perform switching drive of a terminal voltage at the external terminal, an output control unit arranged to generate a drive signal for the switching output stage according to an input pulse signal, a counter arranged to count the number of pulses of the input pulse signal so as to generate a mask signal, a logical gate arranged to mask the input pulse signal according to the mask signal, and a comparator arranged to compare the terminal voltage with a predetermined threshold value voltage so as to generate a reset signal of the counter.

Note that other features, elements, steps, advantages, and characteristics of the present invention will become more apparent from the description of the best mode embodiment given below and the related attached drawings.

DETAILED DESCRIPTION OF THE PREFERRED EMBODIMENTS

<Semiconductor Device>

Figure 1:
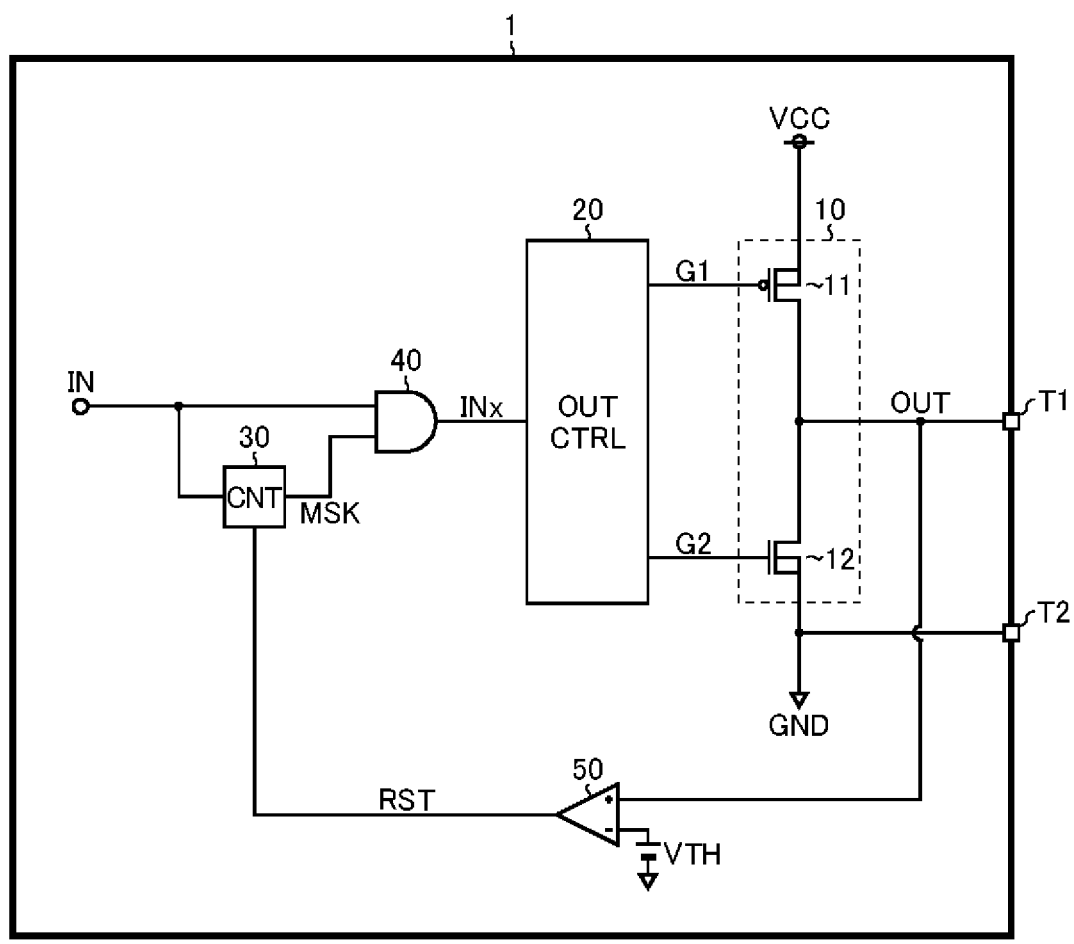
FIG. 1 is a block diagram showing an overall structure of a semiconductor device.

FIG. 1 is a block diagram showing an overall structure of a semiconductor device. A semiconductor device 1 of this structural example includes a switching output stage 10, an output control unit 20, a counter 30, an AND gate 40, and a comparator 50. In addition, the semiconductor device 1 has an external terminal T1 (i.e. a switching drive terminal) and an external terminal T2 (i.e. a ground terminal), which are means arranged to establish electric connection with outside of the device.

The switching output stage 10 is means for performing switching drive of a terminal voltage OUT at the external terminal T1, and in the example of this diagram, a half-bridge type including an upper switch 11 and a lower switch 12 is adopted.

The upper switch 11 is connected between a power supply terminal (i.e. an application terminal of a power supply voltage VCC) and the external terminal T1, and is turned on and off according to a gate signal G1. Note that in the example of this diagram, a P-channel type metal oxide semiconductor field effect transistor (PMOSFET) is used as the upper switch 11. Therefore the upper switch 11 is turned off when the gate signal G1 is high level, while it is turned on when the gate signal G1 is low level.

The lower switch 12 is connected between the external terminal T1 and the ground terminal (i.e. the external terminal T2 applied with a ground voltage GND), and is turned on and off according to a gate signal G2. Note that in the example of this diagram, an N-channel type MOSFET (NMOSFET) is used as the lower switch 12. Therefore the lower switch 12 is turned on when the gate signal G2 is high level, while it is turned off when the gate signal G2 is low level.

The output control unit 20 generates gate signals G1 and G2 (corresponding to drive signals for the switching output stage 10) according to an input pulse signal IN (more precisely, an input pulse signal INx after mask processing). More specifically, the output control unit 20 sets both the gate signals G1 and G2 to low level when the input pulse signal INx is high level, while it sets both the gate signals G1 and G2 to high level when the input pulse signal INx is low level.

Therefore, when the input pulse signal INx is high level, the upper switch 11 is turned on while the lower switch 12 is turned off, and hence the terminal voltage OUT becomes high level (≈VCC). On the contrary, when the input pulse signal INx is low level, the upper switch 11 is turned off while the lower switch 12 is turned on, and hence the terminal voltage OUT becomes low level (GND).

Note that though not clearly shown in this diagram, the output control unit 20 includes drivers (i.e. level shifters) for respectively generating the gate signals G1 and G2, a dead-time setting unit that prevents the both switches from being simultaneously turned on, and the like.

The counter 30 counts the number of pulses of the input pulse signal IN and generates a mask signal MSK according to a count value CNT. Note that the structure and operation of the counter 30 will be described later in detail.

The AND gate 40 generates a logical product calculation signal of the input pulse signal IN and the mask signal MSK, and outputs the same as the input pulse signal INx after mask processing to the output control unit 20. The input pulse signal INx becomes high level when both the input pulse signal IN and the mask signal MSK are high level, while it becomes low level when at least one of the input pulse signal IN and the mask signal MSK is low level.

In other words, when the mask signal MSK is high level (i.e. a logical level when masking is canceled), the input pulse signal IN is output without change (INx=IN). When the mask signal MSK is low level (i.e. a logical level when masking is enabled), the input pulse signal IN is masked (INx=L). In this way, the AND gate 40 functions as a logical gate that masks the input pulse signal IN according to the mask signal MSK.

The comparator 50 compares the terminal voltage OUT input to a noninverting input terminal (+) with a predetermined threshold value voltage VTH input to a inverting input terminal (−) so as to generate a reset signal RST for the counter 30. Note that the reset signal RST becomes high level when the terminal voltage OUT is higher than the threshold value voltage VTH, while it becomes low level when the terminal voltage OUT is lower than the threshold value voltage VTH.

<Counter>

Figure 2:
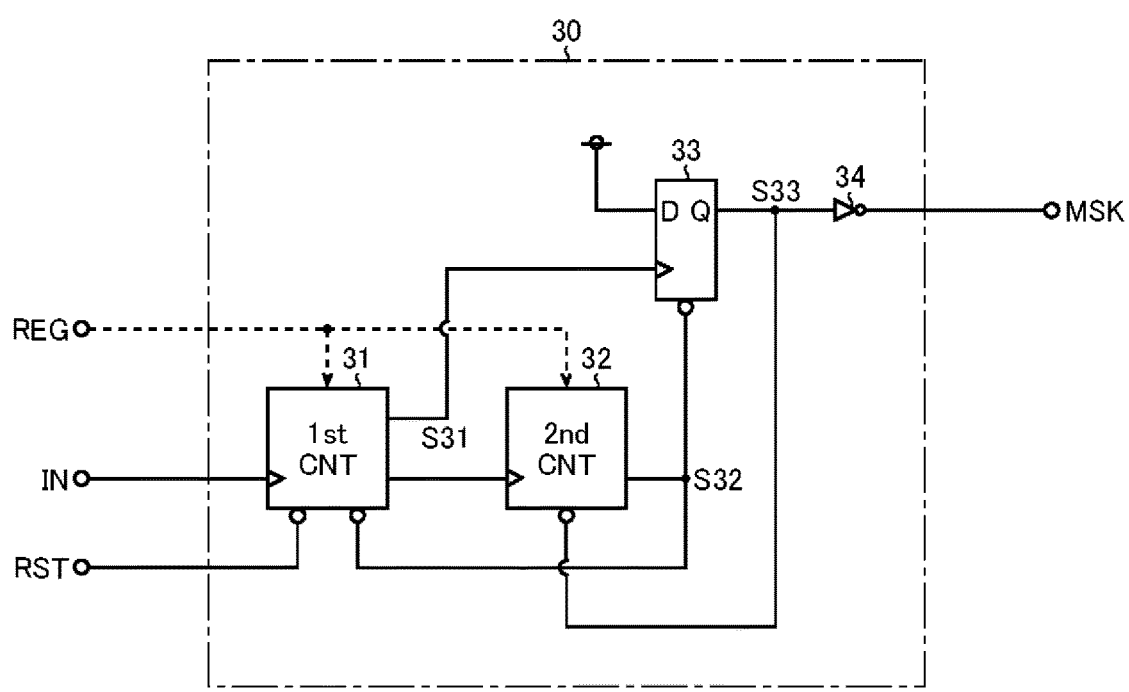
FIG. 2 is a block diagram showing one structural example of a counter.

FIG. 2 is a block diagram showing one structural example of the counter 30. The counter 30 of this structural example includes a first counter unit 31, a second counter unit 32, a D flip-flop 33, and an inverter 34.

The first counter unit 31 is an m-bit counter including a plurality of tandem-connected D flip-flops (D-FFs). The first counter unit 31 receives input of the input pulse signal IN and outputs a first pulse signal S31, which rises to high level when the count value CNT corresponding to the number of pulses of the input pulse signal IN reaches a first set value CNTx (e.g., four counts) (more correctly, a binary signal whose logical level is switched every time when the count value CNT reaches an integer multiple of the first set value CNTx). In addition, an operational state of the first counter unit 31 (namely a logical level of the first pulse signal S31) is reset when at least one of the reset signal RST and a second pulse signal S32 rises to high level. Note that the first set value CNTx is preferably a variable value that can be arbitrarily set according to register data REG.

The second counter unit 32 is an n-bit counter including a plurality of tandem-connected D flip-flops (D-FFs) and is connected to a post-stage of the first counter unit 31. The second counter unit 32 receives input of the first pulse signal S31 and outputs the second pulse signal S32, which rises to high level when the count value CNT reaches a second set value CNTy (e.g. 512 counts). In addition, an operational state of the second counter unit 32 (namely a logical level of the second pulse signal S32) is reset when a third pulse signal S33 rises to high level. Note that the second set value CNTy is preferably a variable value that can be arbitrarily set according to the register data REG, in the same manner as the first set value CNTx described above.

An internal structure of each of the first counter unit 31 and the second counter unit 32 can be realized by using a generally well-known structure (in which an inverted output terminal (QB) of an pre-stage D-FF is connected to a data input terminal (D) of the pre-stage D-FF and a clock input terminal (CK) of a post-stage D-FF), and hence detailed description thereof is omitted.

The D flip-flop 33 receives input of the first pulse signal S31 as a clock signal, and fixes the third pulse signal S33 at an output terminal (Q) to high level (i.e. an applied voltage at the data input terminal (D)) when the first pulse signal S31 rises to high level. Note that an operational state of the D flip-flop 33 (namely a logical level of the third pulse signal S33) is reset when the second pulse signal S32 rises to high level.

The inverter 34 generates a logically inverted signal of the third pulse signal S33 and outputs the same as the mask signal MSK.

<Normal Operation>

Figure 3:
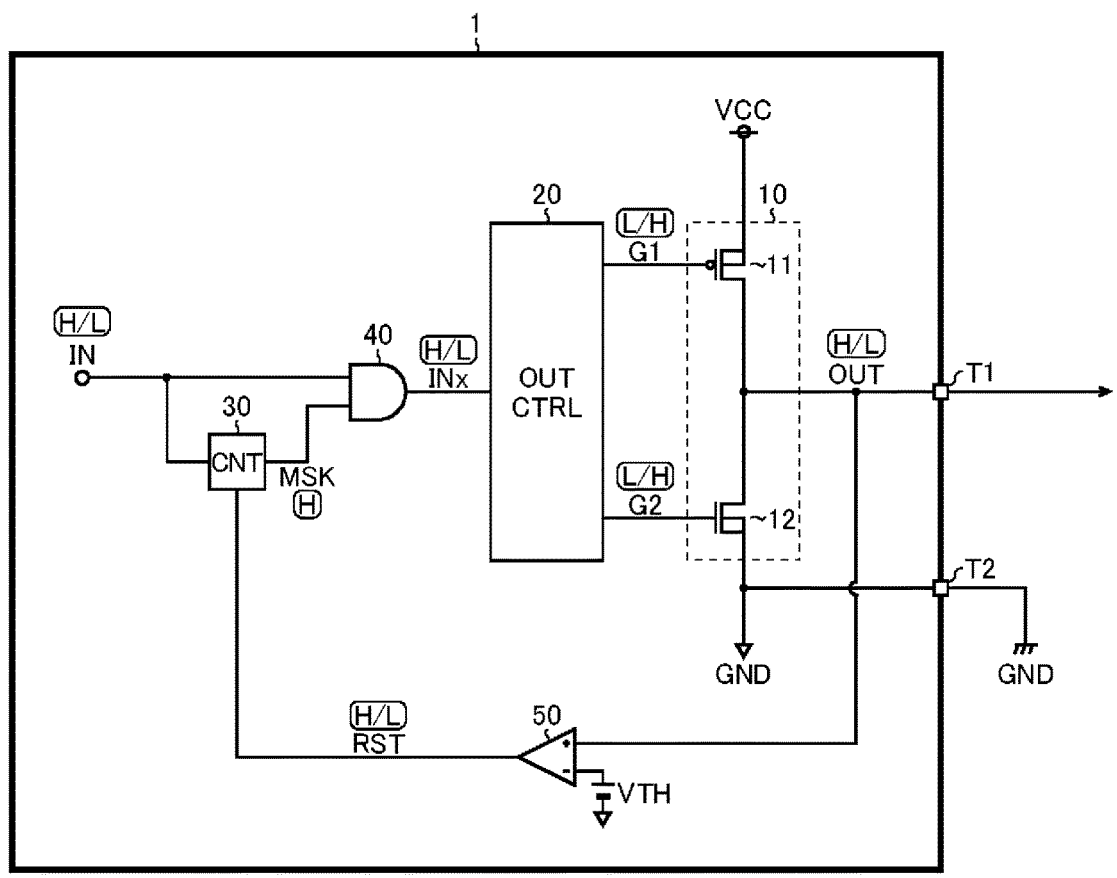
FIG. 3 is a block diagram showing a normal operational state.
Figure 4:
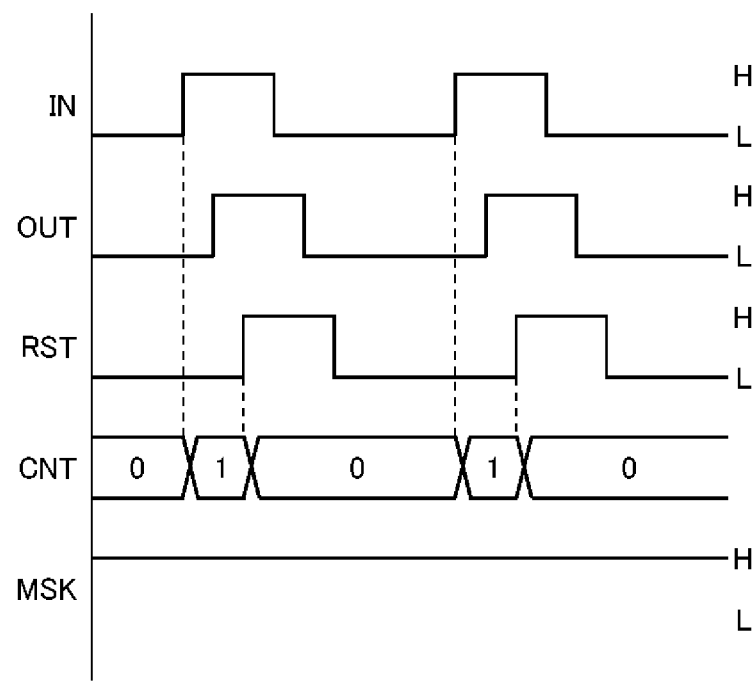
FIG. 4 is a timing chart showing the normal operational state.

First, an operational state of the semiconductor device 1 in normal operation (i.e. when no ground fault occurs at the external terminal T1) is described in detail with reference to FIGS. 3 and 4. Note that FIGS. 3 and 4 are respectively a block diagram and a timing chart showing an operational state of the semiconductor device 1 in normal operation. Note that in FIG. 4, the input pulse signal IN, the terminal voltage OUT, the reset signal RST, the count value CNT, and the mask signal MSK are shown in order from the top.

When no ground fault occurs at the external terminal T1, the terminal voltage OUT is switching-driven according to ON/OFF of the upper switch 11 and the lower switch 12. More specifically, when the input pulse signal IN (namely the input pulse signal INx) is high level, the gate signals G1 and G2 are both low level, and the upper switch 11 is turned on while the lower switch 12 is turned off. Therefore, the terminal voltage OUT becomes high level (≈VCC). On the contrary, when the input pulse signal IN is low level, the gate signals G1 and G2 are both high level, and the upper switch 11 is turned off while the lower switch 12 is turned on. Therefore, the terminal voltage OUT becomes low level (≈GND).

Note that when the terminal voltage OUT rises to high level and becomes higher than the threshold value voltage VTH, the reset signal RST becomes high level. On the contrary, when the terminal voltage OUT falls to low level and becomes lower than the threshold value voltage VTH, the reset signal RST becomes low level. In other words, when no ground fault occurs at the external terminal T1, the reset signal RST is also switching-driven.

Further, the operational state (namely count value CNT) of the counter 30 is reset every time when the reset signal RST rises to high level. More specifically, the counter 30 increments the count value CNT by one when a pulse of the input pulse signal IN comes (i.e. when it rises to high level), while it resets the count value CNT to zero when a pulse of the reset signal RST comes (i.e. when it rises to high level). Therefore, in normal operation, the count value CNT does not reach the first set value CNTx (e.g. 4 counts), and hence the mask signal MSK is maintained at high level.

When the mask signal MSK is high level, the input pulse signal IN is not masked, and INx=IN holds. Therefore, switching drive of the terminal voltage OUT according to the input pulse signal IN is not disturbed.

<When Ground Fault Occurs>

Figure 5:
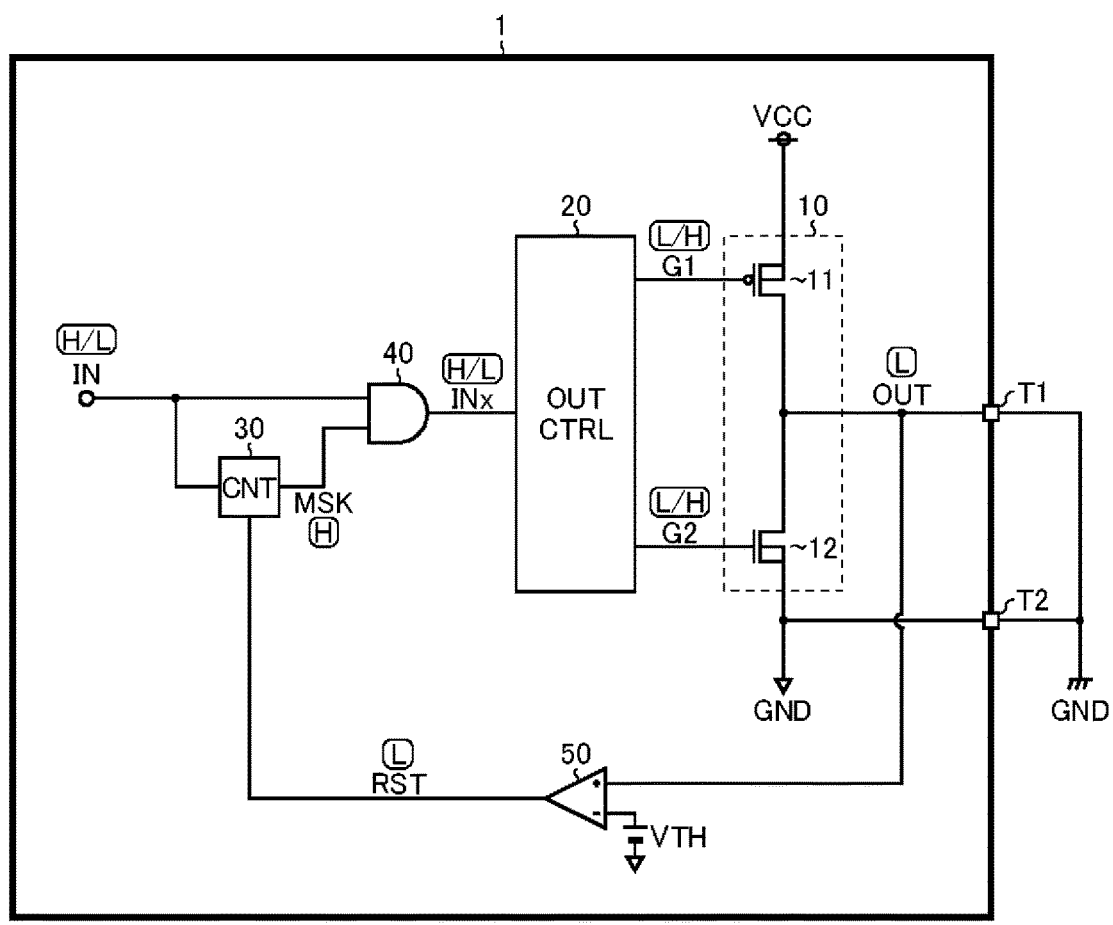
FIG. 5 is a block diagram showing a first operational state when a ground fault occurs (before forced stop).
Figure 6:
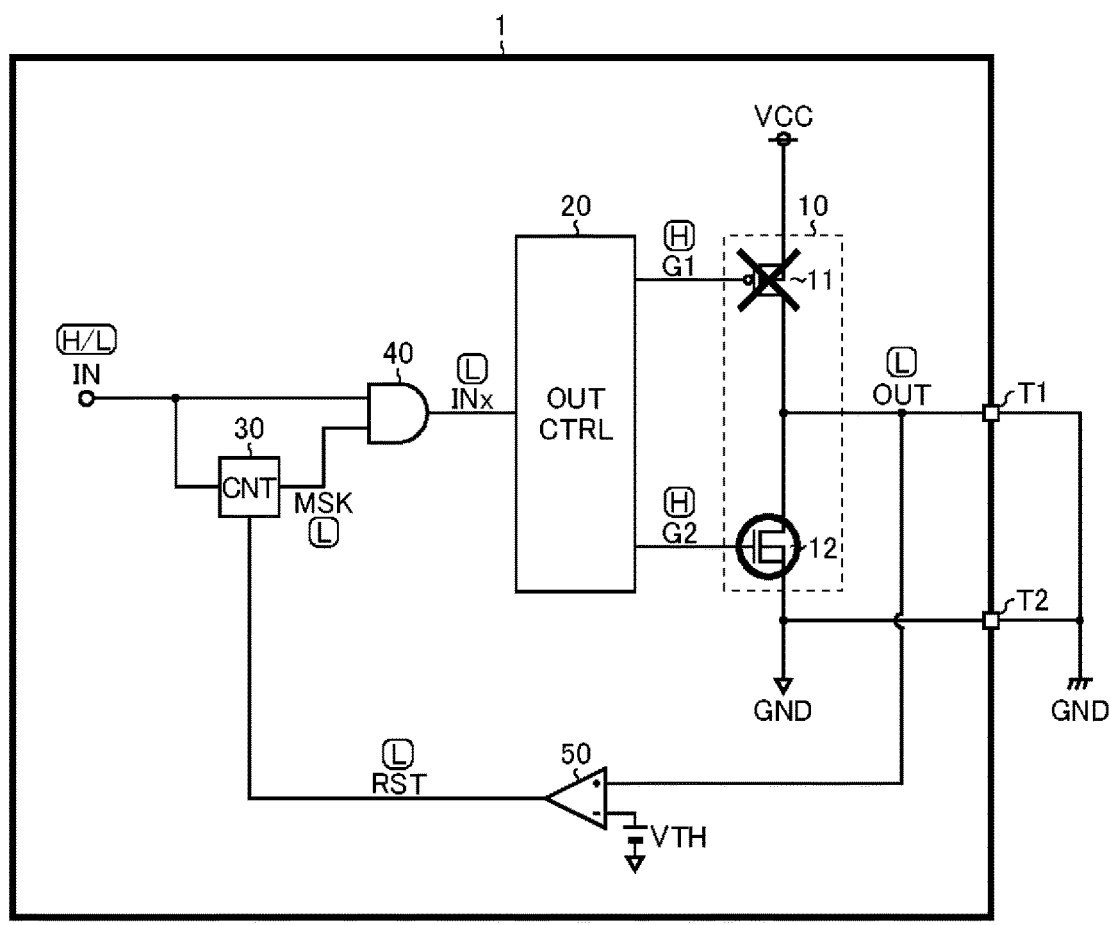
FIG. 6 is a block diagram showing a second operational state when a ground fault occurs (after forced stop).
Figure 7:
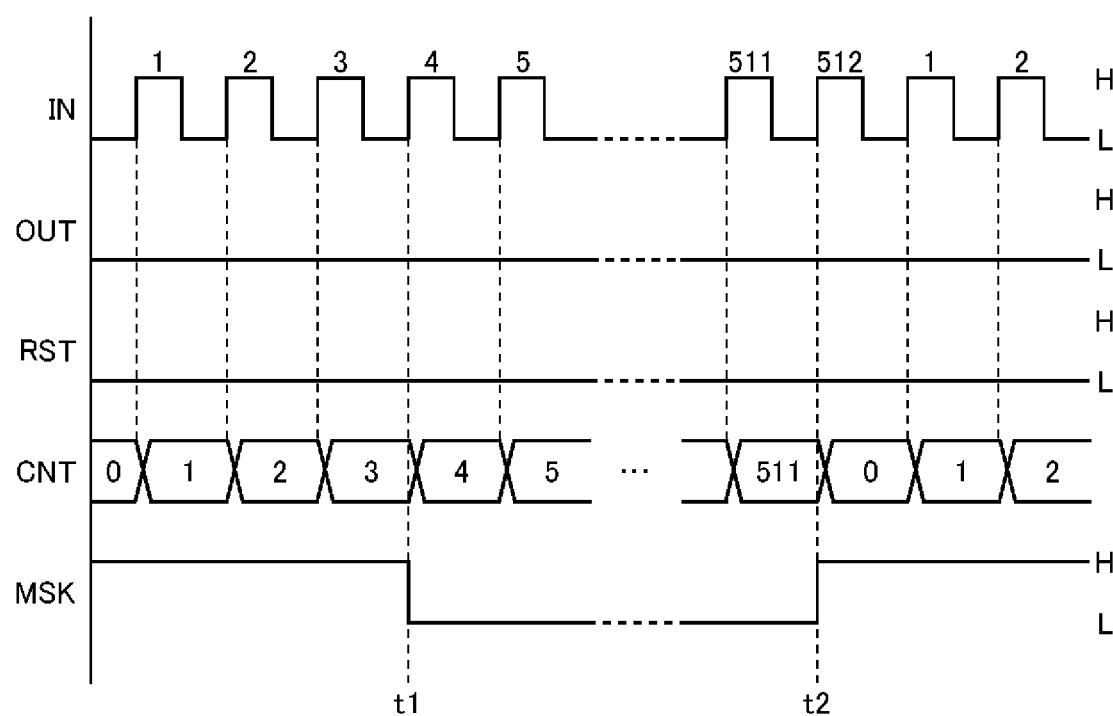
FIG. 7 is a timing chart showing an operational state when a ground fault occurs.

Next, an operational state of the semiconductor device 1 when a ground fault occurs is described in detail with reference to FIGS. 5 and 6. Note that FIGS. 5 and 6 are block diagrams showing respectively a first operational state (before forced stop) and a second operational state (after forced stop) of the semiconductor device 1 when a ground fault occurs. In addition, FIG. 7 is a timing chart showing an operational state of the semiconductor device 1 when a ground fault occurs, in which the input pulse signal IN, the terminal voltage OUT, the reset signal RST, the count value CNT, and the mask signal MSK are shown in order from the top.

When a ground fault occurs at the external terminal T1 due to a board mounting error of the semiconductor device 1 or a malfunction of an application board, the terminal voltage OUT is fixed to a ground voltage GND lower than the threshold value voltage VTH regardless of ON/OFF of the upper switch 11 and the lower switch 12. As a result, the reset signal RST is maintained at low level, and hence the counter 30 continues to count the number of pulses of the input pulse signal IN without being reset in the operational state.

However, as shown in FIG. 5, the mask signal MSK is maintained at high level during a counting period until the count value CNT reaches the first set value CNTx (e.g. 4 counts) (before time point t1), and hence the input pulse signal IN is not masked, so that INx=IN holds. Therefore, switching drive of the terminal voltage OUT according to the input pulse signal IN is not disturbed.

Note that in the above-mentioned counting period, intermittent over current flows between the external terminal T1 and the ground terminal due to ON/OFF of the upper switch 11. Therefore, if the first set value CNTx is too large, a ground fault protection function may be damaged. On the contrary, if the first set value CNTx is too small, an instantaneous drop of the terminal voltage OUT may be misdetected as a ground fault. Therefore, in view of the above-mentioned trade-off, it is desired to set the first set value CNTx to an appropriate value.

After that, when the count value CNT reaches the first set value CNTx without being reset, the mask signal MSK falls to low level (see the time point t1 in FIG. 7). As a result, as shown in FIG. 6, the input pulse signal IN is masked by the AND gate 40 (INx=L), and hence the output control unit 20 fixes both the gate signals G1 and G2 to high level so as to turn off the upper switch 11 and turn on the lower switch 12.

In this way, if the terminal voltage OUT does not change to high level (i.e. if the terminal voltage OUT is maintained to be lower than the threshold value voltage VTH) for a predetermined period, it is regarded that a ground fault has occurred at the external terminal T1, and switching drive of the terminal voltage OUT is forced to stop. Thus, it is possible to prevent power loss, abnormal heat generation, fuming, firing, element breakdown, or the like due to a ground fault.

Note that the counter 30 continues to count the number of pulses of the input pulse signal IN also after the mask signal MSK falls to low level (see the time point t1 to time point t2 in FIG. 7). Further, when the count value CNT reaches the second set value CNTy (e.g. 512 counts) larger than the first set value CNTx, the mask signal MSK rises to high level, and the count value CNT is reset to zero (see the time point t2 in FIG. 7). As a result, the switching drive of the terminal voltage OUT according to the input pulse signal IN is restored, and hence it is possible to regularly recheck whether or not the ground fault at the external terminal T1 is canceled.

<Switching Power Supply>

Figure 8:
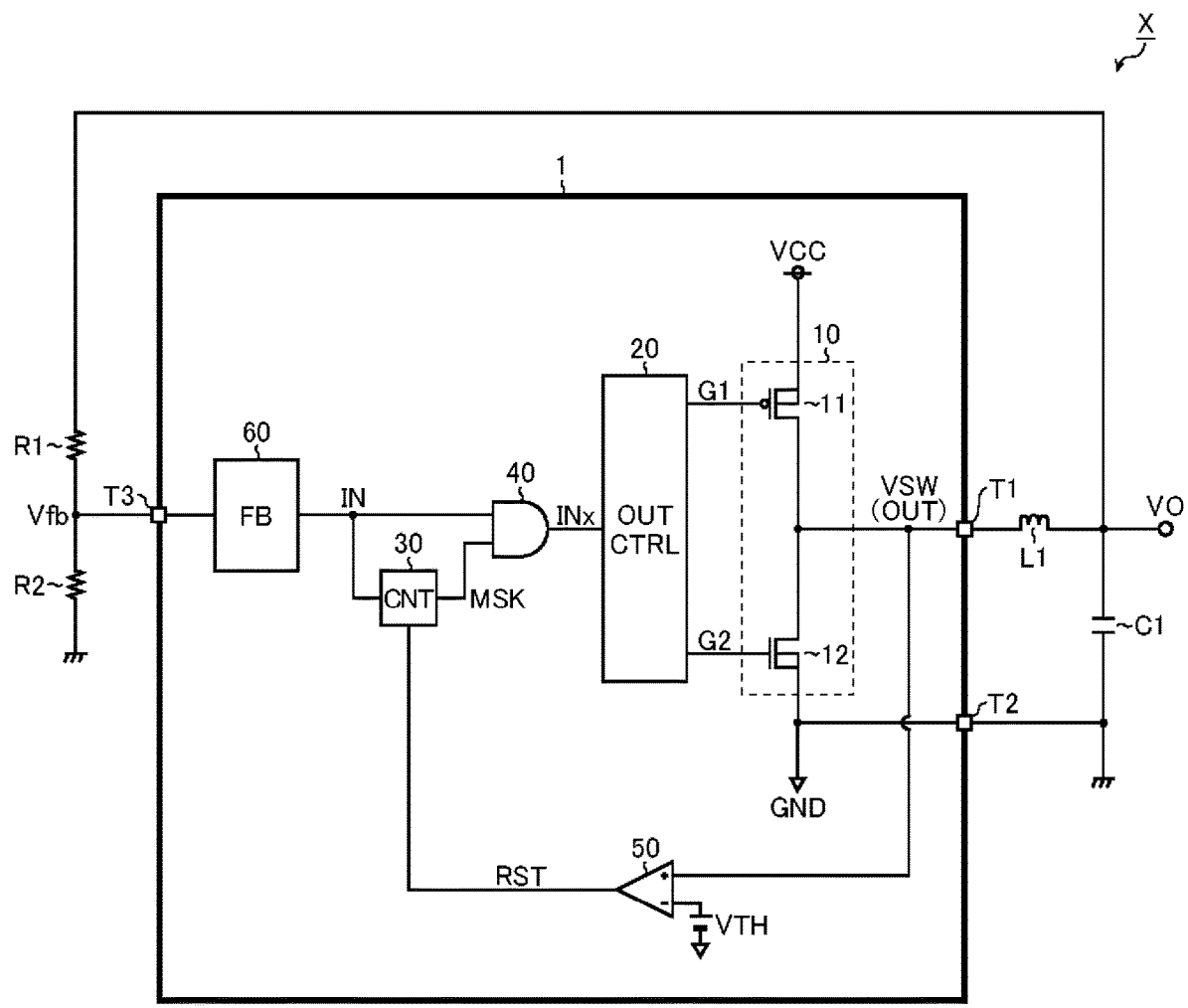
FIG. 8 is a block diagram showing an application example to a switching power supply.

FIG. 8 is a block diagram showing an application example to a switching power supply. A switching power supply X of this structural example includes the semiconductor device 1 described above and various discrete components (an inductor L1, a capacitor C1, resistors R1 and R2) connected externally to the semiconductor device 1, and steps down the power supply voltage VCC so as to generate a desired output voltage VO.

Note that the semiconductor device 1 is provided with an output feedback unit 60 and an external terminal T3 (i.e. a feedback terminal) in addition to the structural elements described above, when it is applied to the switching power supply X.

The external connection of the semiconductor device 1 is described. A first terminal of the inductor L1 is connected to the external terminal T1. A second terminal of the inductor L1 and a first terminal of the capacitor C1 are both connected to the output terminal of the output voltage VO. A second terminal of the capacitor C1 and the external terminal T2 are both connected to the ground terminal. A first terminal of the resistor R1 is connected to the output terminal of the output voltage VO. A second terminal of the resistor R1 and a first terminal of the resistor R2 are both connected to the external terminal T3. A second terminal of the resistor R2 is connected to the ground terminal.

Among various discrete components connected as described above, the inductor L1 and the capacitor C1 function as a smoothing unit that smooths a rectangular wave switch voltage VSW at the external terminal T1 (corresponding to the terminal voltage OUT described above) so as to generate the output voltage VO.

In addition, the resistors R1 and R2 function as a voltage dividing unit that divides the output voltage VO so as to generate a feedback voltage VFB ($=VO \times R2/(R1+R2)$). However, if the output voltage VO is within an input dynamic range of the output feedback unit 60, the resistors R1 and R2 may be eliminated, and hence the output voltage VO may be directly input to the output feedback unit 60.

The output feedback unit 60 generates the input pulse signal IN so that the feedback voltage VFB input to the external terminal T3 matches a predetermined target value. Note that a method of generating the input pulse signal IN can be realized by using a well-known conventional technique such as a pulse width modulation (PWM) control or a pulse frequency modulation (PFM) control, and hence detailed description thereof is omitted.

In this way, by using the semiconductor device 1 described above as a main controller for the switching power supply X (a so-called switching power supply control IC), it is possible to enhance safety and reliability of the switching power supply X.

SUMMARY

Hereinafter, various embodiments disclosed in this specification are described in a summarizing manner.

The semiconductor device disclosed in this specification is configured to include an external terminal, a switching output stage arranged to perform switching drive of a terminal voltage at the external terminal, an output control unit arranged to generate a drive signal for the switching output stage according to an input pulse signal, a counter arranged to count the number of pulses of the input pulse signal so as to generate a mask signal, a logical gate arranged to mask the input pulse signal according to the mask signal, and a comparator arranged to compare the terminal voltage with a predetermined threshold value voltage so as to generate a reset signal of the counter (first structure).

Note that in the semiconductor device having the first structure described above, it is preferred that the counter should be configured to increment a count value when a pulse of the input pulse signal comes while to resets the count value to zero when a pulse of the reset signal comes, and to switch the mask signal to a first logical level when masking is enabled at a time point when the count value reaches a first set value without being reset (second structure).

In addition, in the semiconductor device having the second structure described above, it is preferred that the counter should be configured to continue to count the number of pulses of the input pulse signal also after the mask signal is set to the first logical level, and when the count value reaches a second set value larger than the first set value, the mask signal is switched to a second logical level when masking is canceled, and the count value is reset to zero (third structure).

In addition, in the semiconductor device having the third structure described above, it is preferred that at least one of the first set value and the second set value should be a variable value that can be arbitrarily set (fourth structure).

In addition, in the semiconductor device having the third or fourth structure described above, it is preferred that the counter should be configured to include a first counter unit that outputs a first pulse signal whose logical level is switched when the count value reaches the first set value, a second counter unit that is connected to a post-stage of the first counter unit and outputs a second pulse signal whose logical level is switched when the count value reaches the second set value, and a D flip-flop that receives input of the first pulse signal and fixes a third pulse signal to a predetermined logical level when the logical level of the first pulse signal is switched, in which the first counter unit is reset by the reset signal and the second pulse signal, the second counter unit is reset by the third pulse signal, the D flip-flop is reset by the second pulse signal, and the third pulse signal or a logically inverted signal thereof is output as the mask signal (fifth structure).

In addition, in the semiconductor device having one of the first to fifth structures described above, it is preferred that the switching output stage should be configured to include an upper switch connected between a power supply terminal and the external terminal, and a lower switch connected between the external terminal and a ground terminal (sixth structure).

In addition, in the semiconductor device having the sixth structure described above, it is preferred that the output control unit should be configured to generate the drive signal so as to turn off the upper switch and turn on the lower switch during a period while the input pulse signal is masked (seventh structure).

In addition, in the semiconductor device having the sixth or seventh structure described above, it is preferred that the upper switch be a PMOSFET while the lower switch be an NMOSFET (eighth structure).

In addition, it is preferred that the semiconductor device having one of the first to eighth structures described above should further include an output feedback unit arranged to generate the input pulse signal so that the output voltage or a feedback voltage corresponding to the output voltage matches a predetermined target value (ninth structure).

In addition, the switching power supply disclosed in this specification is configured to include the semiconductor device having the ninth structure described above, a smoothing unit arranged to smooth a terminal voltage at an external terminal of the semiconductor device so as to generate an output voltage, and a voltage dividing unit arranged to divide the output voltage so as to generate the feedback voltage (tenth structure).

According to the invention disclosed in this specification, it is possible to provide a semiconductor device capable of performing appropriate ground fault protection.

OTHER VARIATIONS

Note that various technical features disclosed in this specification can be variously modified, other than the embodiment described above, within the scope of the technical invention without deviating from the spirit thereof. For example, mutual substitution between a bipolar transistor and a MOS field effect transistor, and logical level inversion of various signals can be arbitrarily performed. In other words, the embodiment described above is merely an example in every aspect and should not be interpreted as a limitation. The technical scope of the present invention is defined not by the above description of the embodiment but by the claims and should be understood to include all modifications within meanings and scopes equivalent to the claims.

INDUSTRIAL APPLICABILITY

The invention disclosed in this specification can be applied to a switching power supply control IC, for example.

What is claimed is:
1. A semiconductor device comprising:
an external terminal;
a switching output stage arranged to perform switching drive of a terminal voltage at the external terminal;
a counter arranged to count the number of pulses of an input pulse signal branched to a first path so as to generate a mask signal;
a logical gate arranged to determine according to the mask signal whether to mask the input pulse signal branched to a second path or to pass through the input pulse signal branched to the second path without masking;
an output control unit arranged to generate a drive signal for the switching output stage according to an output signal of the logical gate; and
a comparator arranged to compare a predetermined threshold value with the terminal voltage so as to generate a reset signal of the counter,
wherein the counter increments the count value when a pulse of the input pulse signal comes and resets the count value to zero when a pulse of the reset signal comes, and switches the mask signal to a first logical level when masking is enabled at a time point when the count value reaches a first set value without being reset,
wherein the counter continues to count the number of pulses of the input pulse signal also after the mask signal is set to the first logical level, and when the count value reaches a second set value larger than the first set value, the mask signal is switched to a second logical level when masking is canceled, and the count value is reset to zero,
wherein
the counter includes a first counter unit that receives input of the input pulse signal and outputs a first pulse signal whose logical level is switched when the count value reaches the first set value, a second counter unit that is connected to a post-stage of the first counter unit and outputs a second pulse signal whose logical level is switched when the count value reaches the second set value, and a D flip-flop that receives input of the first pulse signal and fixes a third pulse signal to a predetermined logical level when the logical level of the first pulse signal is switched, the first counter unit is reset by the reset signal and the second pulse signal, the second counter unit is reset by the third pulse signal, the D flip-flop is reset by the second pulse signal, and the third pulse signal or a logically inverted signal thereof is output as the mask signal.

2. The semiconductor device according to claim 1, wherein at least one of the first set value and the second set value is a variable value that can be arbitrarily set.

3. The semiconductor device according to claim 1, wherein the switching output stage includes an upper switch connected between a power supply terminal and the external terminal, and a lower switch connected between the external terminal and a ground terminal.

4. The semiconductor device according to claim 3, wherein the output control unit generates the drive signal so as to turn off the upper switch and turn on the lower switch during a period while the input pulse signal is masked.

5. The semiconductor device according to claim 3, wherein the upper switch is a PMOSFET while the lower switch is an NMOSFET.

6. The semiconductor device according to claim 1, further comprising an output feedback unit arranged to generate the input pulse signal so that an output voltage or a feedback voltage corresponding to the output voltage matches a predetermined target value.

7. A switching power supply comprising:

the semiconductor device according to claim 6;

a smoothing unit arranged to smooth a terminal voltage at the external terminal of the semiconductor device so as to generate the output voltage; and a voltage dividing unit arranged to divide the output voltage so as to generate the feedback voltage.

8. The semiconductor device according to claim 1, wherein when no ground fault occurs at the external terminal, the terminal voltage is switching-driven according to ON/OFF of the switching output stage, and when a ground fault occurs at the external terminal, the terminal voltage is fixed to a ground voltage lower than the threshold value voltage regardless of ON/OFF of the switching output stage.

9. The semiconductor device according to claim 1, wherein the second counter unit receives input of the first pulse signal.

10. The semiconductor device according to claim 1, wherein the first pulse signal is a binary signal whose logical level is switched every time when the count value reaches an integer multiple of the first set value.

* * * * *